(12) United States Patent
Keum

(10) Patent No.: US 7,179,734 B2
(45) Date of Patent: Feb. 20, 2007

(54) METHOD FOR FORMING DUAL DAMASCENE PATTERN

(75) Inventor: Dong-Yeal Keum, Icheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/026,881

(22) Filed: Dec. 30, 2004

(65) Prior Publication Data

US 2005/0153542 A1 Jul. 14, 2005

(30) Foreign Application Priority Data

Dec. 31, 2003 (KR) .................. 10-2003-0101799

(51) Int. Cl.
*H01L 21/4763* (2006.01)
(52) U.S. Cl. ..................................... 438/623
(58) Field of Classification Search .................. None
See application file for complete search history.

(56) References Cited

U.S. PATENT DOCUMENTS

| 4,789,648 | A |   | 12/1988 | Chow et al. |         |
|-----------|---|---|---------|-------------|---------|
| 5,563,105 | A |   | 10/1996 | Dobuzinsky et al. | |
| 6,066,577 | A |   | 5/2000  | Cooney, III et al. | |
| 6,153,511 | A | * | 11/2000 | Watatani    | 438/623 |
| 6,310,300 | B1 |  | 10/2001 | Cooney, III et al. | |
| 6,383,907 | B1 | * | 5/2002 | Hasegawa et al. | 438/597 |
| 6,387,821 | B1 | * | 5/2002 | Aoki        | 438/745 |
| 6,627,540 | B2 | * | 9/2003 | Lee         | 438/638 |
| 2002/0034874 | A1 | * | 3/2002 | Hidemitsu | 438/689 |

FOREIGN PATENT DOCUMENTS

EP          1302981 A2     4/2003

\* cited by examiner

*Primary Examiner*—Michael Lebentritt
*Assistant Examiner*—Andre' C. Stevenson
(74) *Attorney, Agent, or Firm*—Andrew D. Fortney

(57) ABSTRACT

Disclosed is a method for forming a dual damascene pattern. The method includes the steps of forming a lower conductive structure on a lower insulating layer, forming a first protective film, a first insulating film, a second insulating film, a third insulating film, and a second protective film, sequentially, on the lower insulating layer and the lower conductive structure, forming a via hole up to a predetermined depth of the second insulating film through the second protective film and the third insulating film, forming a trench up to the predetermined depth of the second insulating film through the second protective film and the third insulating film, and simultaneously, extending the via hole up to a point at which the first protective film is exposed, and selectively etching the first protective film exposed through the via hole to expose the lower conductive pattern and form the dual damascene pattern.

19 Claims, 2 Drawing Sheets

METHOD FOR FORMING DUAL DAMASCENE PATTERN

CLAIM OF PRIORITY

This application makes reference to, incorporates the same herein, and claims all benefits accruing under 35 U.S.C. §119 from an application for METHOD FOR FABRICATING DUAL DAMASCENE PATTERN filed in the Korean Industrial Property Office on Dec. 31, 2003 and there duly assigned Serial No. 10-2003-0101799.

BACKGROUND OF THE INVENTION (a) Field of the Invention

The present invention relates to a method for fabricating a semiconductor device, and more particularly to a method for forming a dual damascene pattern.

(b) Description of the Related Art

Recently, with a decreased design rule of a semiconductor device, the line width of interconnections becomes smaller, and accordingly, a copper (Cu) interconnection having relatively small resistance (Rs) is increasingly used.

In general, the copper interconnection is formed in a single or dual damascene process. The dual damascene process includes a case where a trench is first formed and a via hole is formed later (the so-called "trench first" method), and a case where a via hole is first formed and a trench is formed later (the so-called "via first" method).

In the latter case where the via hole is first formed and the trench is formed later, copper corrosion can occur due to damage to a nitride film on an underlying copper layer. In order to prevent such copper corrosion, there have been proposed complicated processes where a via hole is filled with photoresist or a bottom antireflective coating material when a dual damascene pattern is formed, in order to prevent nitride film damage.

Accordingly, there is a need for improvement of the dual damascene process for the purposes of simplification and increased yield.

SUMMARY OF THE INVENTION

In consideration of the above circumstances, it is an object of the present invention to provide a simplified method for forming a dual damascene pattern.

To achieve the object, according to an aspect of the present invention, there is provided a method for forming a dual damascene pattern, comprising the steps of:

forming a lower conductive structure on a lower insulating layer;

forming a first protective film, an insulating film, and a second protective film, sequentially, on the lower insulating layer and the lower conductive structure;

forming a via hole up to a first predetermined depth of the insulating film;

forming a trench up to a second predetermined depth of the insulating film, and simultaneously, extending the via hole up to a point at which the first protective film is exposed; and selectively etching the first protective film exposed through the via hole to expose the lower conductive pattern and form the dual damascene pattern.

Preferably, the first protective film includes a silicon nitride layer.

Preferably, the insulating film comprises a first insulating film, a second insulating film having a dielectric constant less than that of the first insulating film, and a third insulating film.

Preferably, the second insulating film includes a FSG layer, and the first insulating film and the third insulating film include a silicon oxide layer formed by plasma depositing silicon dioxide from a feed gas comprising a silane.

Preferably, the second insulating film is formed at a thickness greater than that of the first insulating film or the third insulating film.

Preferably, a target overetch is used in the step of forming a via hole up to a predetermined depth of the second insulating film. Preferably, the via is etched to a target depth of about the total thickness of the insulator film and the second protective layer, minus the target depth of the trench divided by the target overetch value.

Preferably, the second protective film is removed at the same time that the first protective film exposed through the via hole is selectively etched.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENT

A preferred embodiment of the present invention will now be described in detail with reference to the accompanying drawings. The following embodiment may be modified in various forms, but should not be interpreted to be limited thereto. The following embodiment is provided for sufficient understandings of the present invention by those skilled in the art.

FIGS. 1 to 4 are schematic sectional views illustrating a method for forming a dual damascene pattern according to an embodiment of the present invention.

Figure 1:
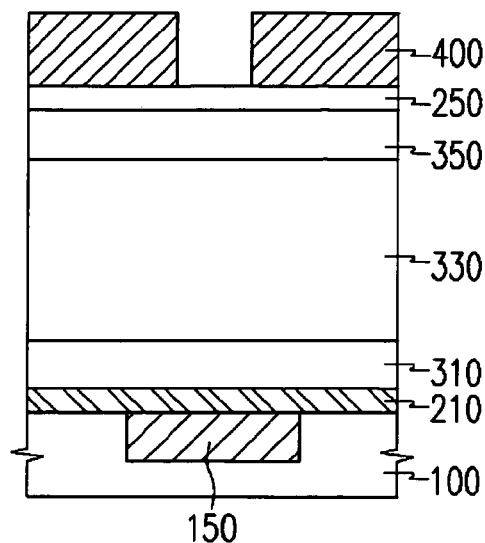
FIGS. 1 to 4 are schematic sectional views illustrating a method for forming a dual damascene pattern according to an embodiment of the present invention.

Referring to FIG. 1, a lower insulating layer 100 is formed on a semiconductor substrate (not shown), and a patterned lower copper structure 150 is formed on the lower insulating layer 100 using a damascene process. For example, after a first trench is formed on the lower insulating layer 100, a copper layer with which the first trench is filled is formed using an electroplating process, and thereafter, the lower copper structure 150 with which the first trench is filled is formed by polishing the copper layer using a chemical mechanical polishing (CMP) process. The lower copper structure or layer 150 may further contain a conventional adhesive layer (e.g., Ti) and/or diffusion barrier layer (e.g., TiN, TaN, etc.) and conventional vias for interconnecting with underlying layers of metallization and/or silicon (which may take the form of a polysilicon and/or metal silicide gate, a heavily doped source/drain junction in a silicon substrate, etc.).

Subsequently, a first protective film 210 for protecting the lower copper pattern 150 in a subsequent process is formed on the lower insulating layer 100. The first protective film 210 preferably comprises a silicon nitride layer. Also, the first protective film 210 can be used as an etch stop film in a subsequent via formation process.

An insulating layer (which may comprise a plurality of insulating films) is formed on the first protective film 210. For example, the insulating layer may comprise a triple-layered structure having a first insulating film 310, a second insulating film 330 and a third insulating film 350.

For example, the first and third insulating films 310 and 350 may comprise a silicon oxide layer made of plasma silane (P—SiH$_4$; e.g., an undoped silica glass [USG] from a feed gas comprising a silane [e.g., SiH$_4$, Si$_2$H$_6$, etc.] and an oxygen source such as O$_2$, O$_3$, N$_2$O, etc., decomposed in a plasma) using a chemical vapor deposition (CVD) process. The second insulating film 330 may comprise a silicon oxide layer made of fluorine doped silica glass (FSG) having a dielectric constant relatively smaller than plasma silane. At this time, the thickness of the first insulating film 310 is similar to that of the third insulating film 350, and the thickness of the second insulating film 330 is greater than those of the first and third insulating films 310 and 350. Alternatively, the insulating layer may comprise a single layer or bilayer of doped or undoped silicate glass (e.g., USG, BSG, PSG, BPSG, or FSG containing a low concentration of fluorine).

After forming the insulating films 310, 330 and 350 in a sandwich structure, a second protective film 250 is formed on the third insulating film 350. The second protective film 250 may comprise an insulating material, for example, a silicon nitride, having an etch rate similar to that of the first protective film 210. The second protective film 250 prevents a surface of the third insulating film 350 from being damaged or etched in a subsequent process.

Figure 2:
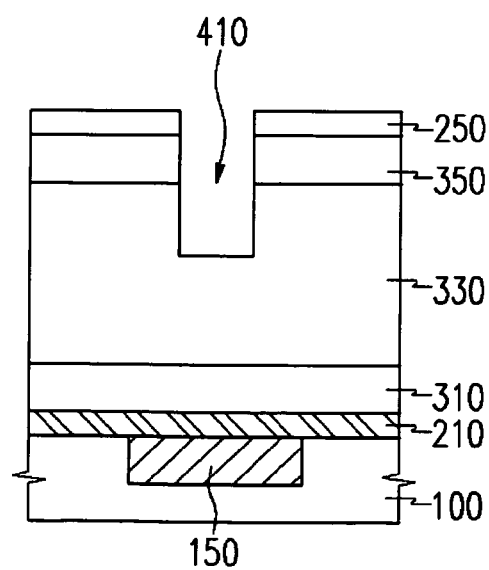

Next, a first photoresist pattern 400 is formed as a via etch mask for forming a via hole on the second protective film 250. Referring to FIG. 2, a via hole 410 is formed using the first photoresist pattern 400 as an etch mask. The via hole 410 is formed through the second protective film 250 and the third insulating film 350, up to a certain depth into the second insulating film 330. Preferably, the via is etched to a target depth of about the total thickness of the insulator layer (e.g., insulator films 310–350) and the second protective layer 250, minus the target depth of the trench divided by a target overetch value. The target overetch value relates to an overetch intended to allow for process variations due to error margins, and is determined empirically by known methods. At this time, in one embodiment, the via may be overetched by about 10%, making the target overetch value about 1.1.

Figure 3:
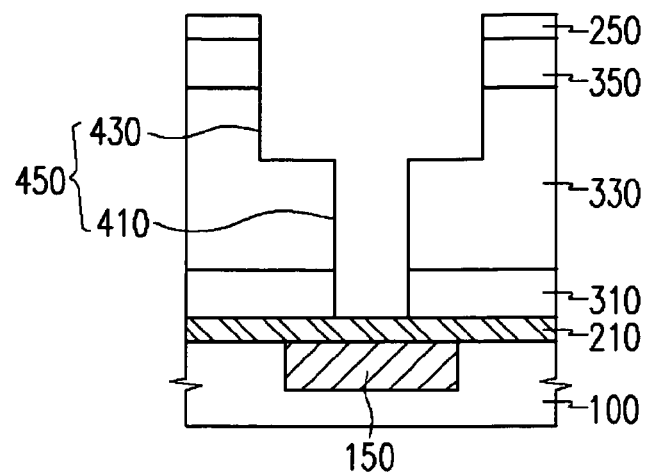

Referring to FIG. 3, after the first photoresist pattern 400 is removed, a second photoresist pattern (not shown) to be used as an etch mask for formation of a trench 430 is formed, and the insulating layer is anisotropically etched and/or patterned using the second photoresist pattern as the etch mask. Namely, the second protective film 250, the third insulating film 350, the second insulating film 330 and the first insulating film 310 are etched in the trench-forming etch step. The trench 430 is substantially formed after this etching process is completed.

The etching process for forming the trench 430 is performed to a target depth of the trench 430. While the etching process is performed, the via hole 410 exposes the first protective film 210 on the lower copper pattern 150. At this time, since the first protective film 210 comprises a material (e.g., silicon nitride) having an etch selectivity higher than that of silicon oxides (e.g., USG, FSG), the etching process for the via hole 410 is performed up to a point at which the first protective film 210 is exposed. Thereafter, the second photoresist pattern is removed.

Figure 4:
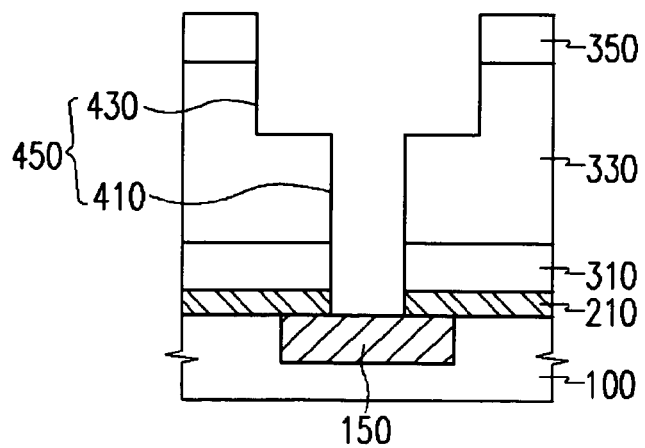

Referring to FIG. 4, the first protective layer 210 within the via hole 410 is etched to expose the top surface of the lower copper pattern 150. This etching process is performed as an entire surface etching process (i.e., without an etch mask). At this time, the second protective film 250 is also etched away. Accordingly, to dual damascene pattern 450 composed of the via hole 410 and the trench 430 is completed. Thereafter, a copper interconnection is implemented by forming an upper copper pattern (which may further contain a conventional adhesive and/or diffusion barrier layer as described above between the copper and the insulating layer or films) as an upper conductive layer with which the dual damascene pattern 450 is filled.

As is apparent from the above description, according to the present invention, a dual damascene pattern including a via hole and a trench can be simply implemented. Accordingly, the yield of semiconductor device can be improved, and product costs thereof can be reduced. In addition, since contamination and/or corrosion of the lower copper interconnection can be prevented, device reliability can be improved.

Although the preferred embodiment of the present invention has been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A method for forming a dual damascene pattern, comprising the steps of:
   forming a lower conductive structure on a lower insulating layer;
   forming a first protective film, a second insulating layer, and a second protective film, sequentially, on the lower insulating layer and the lower conductive structure, wherein the second insulating layer consists essentially of a first insulating film, a low dielectric constant layer, and a third insulating film, the low dielectric constant layer consisting of a single material and having a thickness greater than those of the first insulating film or the third insulating film;
   forming a via hole up to a first predetermined depth by removing a partial thickness of the low dielectric constant layer in the second insulating layer through the second protective film;
   forming a trench up to a second predetermined depth of the second insulating layer through the second protective film, and simultaneously, extending the via hole up to a point at which the first protective film is exposed; and
   selectively etching the first protective film exposed through the via hole to expose the lower conductive pattern and form the dual damascene pattern.

2. The method of claim 1, wherein the first protective film comprises silicon nitride.

3. The method of claim 1, wherein the low dielectric constant layer consists essentially of an insulating material having a dielectric constant less than that of the first insulating film or the third insulating film.

4. The method of claim 3, wherein low dielectric constant layer consists essentially of a fluorosilicate glass (FSG).

5. The method of claim 3, wherein the first insulating film and the third insulating film are formed by plasma depositing a silane.

6. The method of claim 1, wherein the via hole forming step comprises a target overetch of the second insulating layer.

7. The method of claim 6, wherein the via hole is etched to a first target depth of about a total thickness of the second insulator layer and the second protective layer, minus a second target depth of the trench divided by a target overetch value.

8. The method of claim 1, wherein the step of selectively etching the first protective film also removes the second protective film at the same time.

9. The method of claim 8, wherein the second protective film comprises silicon nitride.

10. A method for forming a dual damascene pattern, comprising the steps of:

in a structure comprising a lower conductive pattern on a lower insulating layer, a first protective film thereon, a second insulating layer consisting essentially or a first insulating film, a low dielectric constant layer, and a third insulating film on the first protective film, and a second protective film on the second insulating layer, forming a via through the second protective film, up to a first predetermined depth into the second insulating layer and partially through the low dielectric constant layer, the low dielectric constant layer consisting of a single material and having a thickness greater than those of the first insulating film or the third insulating film;

forming a trench through the second protective film, up to a second predetermined depth of the second insulating layer, and simultaneously extending the via to expose the first protective film; and etching the first protective film exposed through the via to expose the lower conductive pattern.

11. The method of claim 10, wherein the first and second protective films comprise silicon nitride.

12. The method of claim 10, wherein the low dielectric constant layer consists essentially of an insulating material having a dielectric constant less than that of the first insulating film or the third insulating film.

13. The method of claim 12, wherein the low dielectric constant layer consists essentially of a fluorosilicate glass (FSG).

14. The method of claim 10, wherein the via forming step comprises a target overetch of the second insulating layer.

15. The method of claim 14, wherein the via is etched to a first target depth of about a total thickness of the second insulator layer and the second protective layer, minus a second target depth of the trench divided by a target overetch value.

16. The method of claim 10, wherein the step of selectively etching the first protective film also simultaneously removes the second protective film.

17. A method for forming a dual damascene pattern, comprising the steps of:

forming a lower conductive structure on a lower insulating layer;

forming a first protective film, a second insulating layer, and a second protective film, sequentially, on the lower insulating layer and the lower conductive structure, the second insulating layer consisting essentially of a first USG layer, a low dielectric constant layer having a dielectric constant smaller than that of a plasma silane layer, and a second USG layer;

forming a via hole up to a first predetermined depth by removing a partial thickness of the low dielectric constant layer in the second insulating layer through the second protective film;

forming a trench up to a second predetermined depth of the second insulating layer through the second protective film, and simultaneously, extending the via hole up to a point at which the first protective film is exposed; and selectively etching the first protective film exposed through the via hole to expose to lower conductive pattern and form the dual damascene pattern.

18. The method of claim 17, wherein the low dielectric constant layer consists essentially of a fluorosilicate glass (FSG).

19. The method of claim 17, wherein the low dielectric constant layer has a thickness greater than that of the first USG layer or the second USG layer.

* * * * *